United States Patent
Wu et al.

[11] Patent Number: 5,807,959
[45] Date of Patent: Sep. 15, 1998

[54] FLEXIBLE EPOXY ADHESIVES WITH LOW BLEEDING TENDENCY

[75] Inventors: Bing Wu, Marina Del Rey, Calif.; Quinn K. Tong, Belle Mead; Robert W. R. Humphreys, Annandale, both of N.J.

[73] Assignee: National Starch and Chemical Investment Holding Corporation, Wilmington, Del.

[21] Appl. No.: 805,706

[22] Filed: Feb. 25, 1997

Related U.S. Application Data

[63] Continuation-in-part of Ser. No. 576,725, Dec. 21, 1995.
[51] Int. Cl.⁶ ............. B32B 33/00; C08G 59/00; C08G 65/14
[52] U.S. Cl. ............. 528/101; 156/90; 156/244.12; 156/244.24; 156/307.3; 156/307.5; 156/307.7; 156/330; 428/413; 428/416; 428/418; 428/626
[58] Field of Search .................. 156/90, 244.12, 156/244.24, 307.3, 307.5, 307.7, 330; 428/626, 413, 416, 418; 528/101

[56] References Cited

U.S. PATENT DOCUMENTS 2,965,607  12/1960  Martin et al. ............. 260/47

OTHER PUBLICATIONS

Chemical Abstracts 12034a, "Allyl 2,4,6–Triallylphenyl Ether and Derivatives", Mar. 1960.

*Primary Examiner*—Frederick Krass
*Attorney, Agent, or Firm*—Jane E. Gennaro

[57] ABSTRACT

For use in microelectronics applications, an improvement to an epoxy resin composition to reduce bleeding of the composition when it is applied to a silicon or metal substrate consists in the addition to the composition of a polyhydroxyl compound having two or three hydroxyl groups, or of a monohydroxyl compound that also contains one or more phenyl groups. The hydroxyl compound is present in the composition in a ratio by weight to the flexibilizing compound of from 1:3 to 1:10.

4 Claims, No Drawings

FLEXIBLE EPOXY ADHESIVES WITH LOW BLEEDING TENDENCY

This is a continuation-in-part of patent application Ser. No. 08/576,725, filed Dec. 21, 1995, now abandoned.

FIELD OF THE INVENTION

This invention relates to flexible epoxy adhesives that have resistance to bleeding or spreading after application to a substrate.

3BACKGROUND OF THE INVENTION

In the manufacture of semiconductor devices, epoxy compounds are preferred as the die attach or encapsulating materials due to their superior adhesive strength. Epoxies, however, are inherently brittle, making them susceptible to the stress of thermal cycling in manufacturing procedures and potentially leading to adhesive failure or fracture of the die or chip. Recent advances in epoxy technology have resulted in flexible epoxy compounds, obtained by the incorporation into the epoxy polymer of long aliphatic chains, the absence or minimum presence of ring structures, low levels of crosslinking, and easy rotation about polymeric bonds. Another means of adding flexibility to epoxies is by modification with siloxane compounds, which can also increase hydrophobicity.

Despite the advantages obtained by adding flexibility, the modified epoxies tend to bleed or spread when applied to a substrate. This presents a problem when the epoxy is used in bonding a semiconductor component to a metallized or metallic substrate, such as a copper lead frame, or to a silicon chip. If the adhesive bleeds onto the bond pads used for wire connections to external circuitry, the strength and reliability of the wire connections are reduced.

SUMMARY OF THE INVENTION

This invention is an improvement to a flexible epoxy resin composition that reduces the bleeding of the composition on a silicon or metal or metallized substrate after application before or during cure. The epoxy resin composition, which after cure crosslinks to a thermoset adhesive, consists of an epoxy resin, a flexibilizing compound that is compatible and reactive with the epoxy resin, and a curing catalyst and fillers, or an epoxy resin that is inherently flexible, optionally a flexibilizing compound that is compatible and reactive with the epoxy resin, and a curing catalyst and fillers. Compatible in this sense means that the flexibilizing compound is chosen so that it will not phase separate from the epoxy resin. The flexibilizing compounds preferably are long chain aliphatic compounds, with or without siloxane moieties, and are epoxy-, or amine-terminated for reaction with the epoxy resin.

The improvement comprises the addition to the epoxy resin composition of a polyhydroxyl compound having two or three hydroxyl groups, or of a monohydroxyl compound that also contains one or more phenyl groups (the phenyl groups, however, are not condensed aromatic rings). The hydroxyl compound will be present in an amount effective to reduce the bleeding of the epoxy resin on a silicon or metallized substrate, and generally in an amount such that the ratio by weight of the hydroxyl compound to the flexibilizing agent is from 1:3 to 1:10. The hydroxyl compound will contain no electron withdrawing substituents and preferably will have two to twenty carbon atoms.

In a further embodiment, this invention is a method for reducing the bleeding before and during cure of an epoxy resin composition onto a silicon or metallic or metallized substrate, in which the epoxy resin composition consists of an epoxy resin and a flexibilizing compound, or of a flexible epoxy resin and optionally a flexibilizing compound, and a curing catalyst and fillers, the method comprising admixing with the epoxy composition a polyhydroxyl compound having two or three hydroxyl groups, or of a monohydroxyl compound having one or more phenyl groups, in a ratio by weight to the flexibilizing compound of from 1:3 to 1:10.

DETAILED DESCRIPTION OF THE INVENTION

Exemplary hydroxyl compounds can be phenols, aromatic non-phenolic compounds that contain hydroxy groups, cyclic aliphatic polyhydroxy compounds, and linear aliphatic polyhydroxy compounds. Preferably, the hydroxyl compounds will be the cyclic or linear aliphatic compounds. In general, these hydroxy compounds will not be electron withdrawing, such as are condensed aromatic rings or compounds with substituents, such as, —Cl, —NO$_2$, —CF$_3$, —CO$_2$R, —CH$_2$OR, —CN, or SO$_2$R, where R is an alkyl. Particularly, these compounds will be free of ionic contamination.

Examples of suitable phenols are resorcinol; 2,2-bis(4-hydroxy-phenyl)propane (commonly known as bisphenol A); 4,4'-bisphenol; 4-benzyloxyphenol; bis(4-hydroxyphenyl)methane (commonly known as bisphenol F); and 3,4-dimethylphenol. Examples of aromatic non-phenolic compounds are styrene glycol and phenylethyl alcohol. Examples of linear aliphatic polyhydroxy compounds are ethylene glycol and glycerol. Examples of cyclic aliphatic polyhydroxy compounds are 1,3-dioxane-5,5-dimethanol and ribonic-gamma-lactone, which has the structure

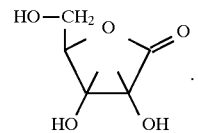

In general, the flexibilizing compounds are of low molecular weight and liquid; as a consequence, it is the flexibilizing component in the composition that causes the composition before or during cure to bleed and spread on a substrate, whether that flexibilizing component is the inherently flexible epoxy or an added flexibilizing compound. Therefore, the amount of hydroxy compound used to prevent bleeding will be measured in relation to the amount of flexibilizing component in the formulation. The preferred amount of hydroxy compound will be in a ratio by weight of the flexibilizing component to the hydroxy compound from 1:3 to 1:10, preferably from 1:5 to 1:7.

The epoxy resins that are not inherently flexible and that can be used in these compositions are any of the epoxy resins commonly used in formulating adhesives. Exemplary resins are phenolic epoxy resins containing one or more epoxy groups per molecule. They can be monomeric or polymeric in nature. The weights per epoxide of these resins will be within the range of about 80 to 200. Preferably the compounds will contain glycidyl ether or ester groups. Suitable epoxies include, for example, polyglycidyl ethers produced by the reaction between a polyhydric phenol (e.g., bisphenol A, bisphenol F, catechol, resorcinol) and epichlorohydrin; polyglycidyl ether esters produced by the reaction between a hydroxycarboxylic acid (e.g., p-oxybenzoic acid, beta-oxynaphthoic acid) and epichlorohydrin; polyglycidyl esters obtained from a polycarboxylic acid (e.g., phthalic acid, terephthalic acid); glycidylamine compounds obtained from 4,4'-diaminodiphenyl methane, and m-aminophenol.

The inherently flexible epoxy resins that are suitable for use in these compositions may be, for example, those formed by the reaction of glycidol with dimer fatty acids, or those that are commercially available, such as, an epoxy novolac resin sold under the tradename Cardolite NC 547, a product of Cardolite Corporation, the diglycidyl ester of linoleic dimer acid, sold under the tradename EPON 871, a product of Shell Chemical, and a glycidyl ether sold under the tradename DER 732 or DER 736, a product of Dow Chemical. These inherently flexible epoxy resins will have weight per epoxy of about 250 to 800, preferably 300 to 500.

If the epoxy resins used are those that are inherently flexible, the composition may be made without additional flexibilizing compounds, although such flexibilizing compounds may be added. However, if the epoxies are not inherently flexible, a flexibilizing compound is added to the epoxy resin composition. These flexibilizing compounds are typically long chain aliphatic compounds that are compatible and reactive with the epoxy. Examples of suitable flexibilizing compounds are aliphatic amines such as those sold under the trademark Jeffamine D-2000 by Huntsman Corporation, epoxidized polybutadienes, and epoxy compounds such as those sold under the trademark Epon 871 by Shell Chemical Corporation.

Preferably the flexibilizing compounds are those that contain siloxane moieties. Flexibilizing compounds that contain siloxane moieties will be particularly those with small, e.g., methyl, substituents on the silicon atoms, to give fairly easy rotation about the SiO axis. For identification purposes, the nomenclature of the siloxane compounds is commonly simplified by the use of the letters M, D, T, and Q to represent monofunctional, difunctional, trifunctional, and quadrifunctional monomer units, respectively. For example, the monofunctional unit has the formula $(CH_3)_3SiO_{0.5}$ and is represented by the symbol M; the difunctional unit has the formula $(CH_3)_2SiO$ and is represented by the symbol D. If the symbol has a prime, for example D', the unit has a substituent other than methyl, which must be specifically identified, for example, a phenyl substituent. Using the above nomenclature, suitable and preferable siloxane compounds will be linear, have methyl substituents, and correspond to the formula $MD_{6-20}M$.

In general, the curing catalyst can be any effective curing catalyst and is used in a catalytically effective amount. The preferred curing catalyst is an imidazole catalyst, which typically will be present in an amount of about 4 to 5 parts per hundred parts of epoxy plus siloxane. Suitable imidazoles are imidazole, 2-ethylimidazole, 2-ethyl-4-methylimidazole, 2-phenylimidazole, 2-phenyl-4-methylimidazole, and 2-undecylimidazole. Other suitable catalysts include tertiary amines, phosphonium compounds, ammonium compounds, sulfonium compounds, and phosphines, such as are known in the art.

The epoxy resin compositions are generally used in conjunction with additives to reinforce or physically strengthen the resultant adhesives or to act as electrical or thermal conductive fillers. Examples of such fillers are silver or gold powders or flakes; silica; oxides, nitrides, borides, carbides, etc., of various metals; and carbon powder.

These adhesives are suitably used for attaching silicon chips to lead frames, and in particular metal lead frames, in the manufacture of semiconductor devices. In a further embodiment, this invention is a semiconductor device consisting of a silicon chip or die bonded to a lead frame with an epoxy resin composition comprising an epoxy resin, a flexibilizing compound, and a curing catalyst and fillers, or an inherently flexible epoxy, optionally a flexibilizing compound, and a curing catalyst and fillers, and further comprising a polyhydroxyl compound having two or three hydroxyl groups, or a monohydroxyl compound having one or more phenyl groups, in a ratio by weight to the flexibilizing compound of from 1:3 to 1:10.

The following examples demonstrate the kinds of polyhydroxy compounds that are useful to control bleeding of epoxy resin compositions in which flexibilizing compounds were added to impart flexibility. The examples also demonstrate the ratio of polyhydroxy compound to flexibilizing compound that is effective, and suitable die attach formulations.

EXAMPLE I

An epoxy resin composition was prepared by blending a proprietary epoxy with a siloxane having a structure $MD_6M$ (as described before) in the ratio by weight of siloxane to epoxy of 1 to 2.5. Various hydroxy compounds were added in amounts by weight to vary the ratio of hydroxy compound to siloxane. The compounds and ratios were as reported in Table I. For some examples, the hydroxy compounds were first added to the epoxy and heated to melt, about 100° C., then cooled, and the siloxane added after cooling. Twenty parts by weight of the mixture of epoxy, siloxane, and hydroxy compound were then mixed with 80 parts of silver flake (a conductive filler), and a droplet of this composition placed on a metallized lead frame and cured in an oven at 175° C. for 30 minutes. Optical microscopy was used to determine whether or not bleeding had occurred and its extent. A bleeding radius of 2 mil or less is deemed acceptable for industry purposes. The specific hydroxy compound and number of phenyl and hydroxyl groups on that compound, the weight ratio of hydroxy compound to flexibilizing compound (siloxane), and the presence or absence of bleeding are reported in Table I.

TABLE I

| Hydroxy Compound | # of groups —OH phenyl | Ratio flex agent:—OH | Bleeding |
|---|---|---|---|
| phenylethyl alcohol | 1 1 | 3:1 | none |
| 1-dodecanol | 1 | 3:1 | <2 mil |
| 1-propanol | 1 | 3:1 | >5 mil |
| ethylene glycol (anhydrous) | 2 | 3:1 | none |
| phenylethyl alcohol | 1 1 | 6:1 | none |
| 1-dodecanol | 1 | 6:1 | >2 mil |
| ethylene glycol | 2 | 6:1 | none |
| glycerol (anhydrous) | 3 | 10:1 | <2 mil |
| phenylethyl alcohol | 1 1 | 10:1 | <2 mil |
| ethylene glycol (anhydrous) | 2 | 10:1 | <2 mil |
| 1-dodecanol | 1 | 10:1 | >5 mil |
| 1-phenyl-1,2-ethanediol | 1 2 | 6:1 | <2 mil |
| 1,3-dioxane-5,5-dimethanol | 2 | 6:1 | <2 mil |
| 1,3-dioxane-5,5-dimethanol | 2 | 10:1 | <1 mil |

EXAMPLE II

An epoxy resin composition was prepared by blending a bisphenol A epoxy, (sold under the tradename EPON 825 by Shell Chemical Corporation) with a siloxane having a structure MD$_6$M (as described before) in the ratio by weight of siloxane to epoxy of 1 to 0.75. Various hydroxy compounds were added in amounts by weight to vary the ratio of hydroxy compound to siloxane. The compounds and ratios were as reported in Table II. For some examples, the hydroxy compounds were first added to the epoxy and heated to melt, about 100° C., cooled, and the siloxane added after cooling. Twenty parts by weight of the mixture of epoxy, siloxane, and hydroxy compound were then mixed with 80 parts of silver flake, and a droplet of this composition placed on a metallized lead frame and cured in an oven at 175° C. for 30 minutes. The resin bleed was measured as in Example I.

TABLE II

| Hydroxy Compound | # of groups —OH | Ratio flex:—OH | Bleeding |
| --- | --- | --- | --- |
| deionized H$_2$O | 1 | 3:1 | <2 mil |
| glycerol (anhydrous) | 3 | 3:1 | none |
| ethylene glycol | 2 | 3:1 | <2 mil |
| deionized H$_2$O | 1 | 6:1 | <2 mil |
| glycerol (anhydrous) | 3 | 6:1 | <2 mil |
| ethylene glycol | 2 | 6:1 | >2 mil |
| deionized H$_2$O | 1 | 10:1 | <2 mil |
| glycerol (anhydrous) | 3 | 10:1 | <2 mil |
| ethylene glycol | 2 | 10:1 | >2 mil |

EXAMPLE III

An epoxy resin composition was prepared by blending a bisphenol F epoxy (sold under the tradename EPON 862 by Shell Chemical Corporation) with a siloxane having a structure MD$_6$M (as described before) in the ratio by weight of siloxane to epoxy of 1 to 0.70. Various hydroxy compounds were added in amounts by weight to vary the ratio of hydroxy compound to siloxane. The compounds and ratios were as reported in Table III. For some examples, the hydroxy compounds were first added to the epoxy and heated to melt, about 100° C., cooled, and the siloxane added after cooling. Twenty parts by weight of the mixture of epoxy, siloxane, and hydroxy compound were then mixed with 80 parts of silver flake, and a droplet of this composition placed on a metallized lead frame and cured in an oven at 175° C. for 30 minutes. The amount of resin bleed was measured as in Examples I and II.

TABLE III

| Hydroxy Compound | # of groups —OH | Ratio flex:—OH | Bleeding |
| --- | --- | --- | --- |
| deionized H$_2$O | 1 | 3:1 | none |
| glycerol | 3 | 3:1 | <2 mil |
| ethylene glycol | 2 | 3:1 | <2 mil |
| deionized H$_2$O | 1 | 6:1 | <2 mil |
| glycerol | 3 | 6:1 | <2 mil |
| ethylene glycol | 2 | 6:1 | >2 mil |
| deionized H$_2$O | 1 | 10:1 | <2 mil |
| glycerol | 3 | 10:1 | <2 mil |
| ethylene glycol | 2 | 10:1 | >2 mil |

EXAMPLE IV

A. An inherently flexible epoxy resin sold under the tradename Epon 871 by Shell Chemical in 100 parts by weight was blended with 5 parts by weight of 2-ethyl-4-methyl imidazole. This mixture in 25 parts was then blended with 75 parts by weight silver flake (a conductive filler), and a droplet of this composition placed on a metallized lead frame and cured in an oven at 175° C. for 30 minutes. The composition was observed for bleeding according to the above Examples, bleeding occurred at greater than 5 mils.

B. An epoxy resin in 100 parts by weight and having the structure

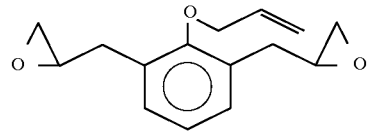

was blended with 5 parts by weight of 2-ethyl-4-methyl imidazole. This mixture in 25 parts was then blended with 75 parts by weight silver flake, and a droplet of this composition placed on a metallized lead frame and cured in an oven at 175° C. for 30 minutes. The composition was observed for bleeding according to the above Examples, and bleeding occurred at greater than 5 mils.

C. Each of the above two compositions, before mixing with the silver flakes, was admixed with 5 parts by weight of the following hydroxy compounds, representing a ratio of flexible epoxy to hydroxyl/phenyl compound of 100 to 5. These compositions were cured and tested as described in the above Examples. None of the compositions exhibited any bleeding. The hydroxy compounds tested were the following: 4,4'-bisphenol, 4-benzyloxy phenol, a bisphenol F novolac resin, phenylethyl alcohol, and 3,4-dimethyl phenol.

EXAMPLE V

Performance as Die Attach Adhesives. A control epoxy resin composition, which did not contain a polyhydroxy compound, and several epoxy resin compositions, which did contain polyhydroxy compounds, were prepared and tested for performance as die attach adhesives by measuring the die shear strength and radius of curvature after cure.

Die shear is a measure of the strength of the cured epoxy resin composition, and is the force required to remove a silicon chip bonded to a substrate with the cured epoxy composition. Die shear can be a measure of both cohesive and adhesive strength, depending on the conditions to which the composite die/epoxy resin/substrate is subjected after cure.

The epoxy resin compositions had the formulations as reported below in Table V. Twenty parts by weight of each of these formulations were blended with 80 parts by weight silver flake (a conductive filler), applied between the interface of a silicon die and a copper lead frame, and cured by heating at 175° C. for 60 minutes.

Die shear strength was measured on silicon chips (80×80 mil$^2$) using a Hybrid Machine Products Corp. die shear tester (Model 1750)/ Chatillon DFI 50 digital force gauge. The force required to remove the bonded die was read in kg units, and converted to a die shear strength in MPa averaged over five samples. Tests were performed after cure (i) at room temperature (RT die shear), (ii) at 250° C. after heating for 250° C. for one minute (250° die shear) (to simulate wire bonding), (iii) at room temperature after boiling in water for two hours (wet RT die shear); and (iv) at 250° C., after boiling the die in water for two hours, and then heating at 250° C. for one minute (wet/hot die shear) (intended to test resistance to moisture and the phenomenon known as "popcorn", a mechanical failure of fully encapsulated packages after moisture exposure during solder reflow process, 220° to 260° C.).

The formulations were tested for radius of curvature (ROC) (flexibility) on silicon chips (200×600 mil²) after curing. Measurements were taken at room temperature and at 250° C. after heating for 250° C. for one minute (250°) on a hot plate using a Tokyo Seimitsu SURFCOM surface texture measuring instrument, reported in millimeter (mm) units, averaged over five samples.

The sample formulations and results of the performance tests are reported in Table V. The data show that the incorporation of hydroxy compounds prevented resin bleed without causing any loss in flexibility or adhesive properties.

TABLE V

| SAMPLE | A | | B | | C | | D | |
|---|---|---|---|---|---|---|---|---|
| Formula in parts by weight | BIS F 2130 Epoxy X MD₆M DICY | 20 20 20 40 | BIS F 2130 MD₆M DICY Dioxane meth-anol | 30 20 50 4 4 | BIS F 2130 MD₆M DICY H₂O | 30 20 50 4 10 | BIS F 2130 MD₆M DICY 1,3 dioxane-5,5-di-methanol | 30 30 50 4 10 |
| Bleed | >5 mil | | none | | none | | none | |
| Die Shear | | | | | | | | |
| RT | 2400 psi | | 2100 psi | | 2400 psi | | 2200 psi | |
| 250° C. | 330 psi | | 330 psi | | 280 psi | | 310 psi | |
| wet RT | 1400 psi | | 1140 psi | | 1000 psi | | 1300 psi | |
| wet/hot | 100 psi | | 140 psi | | 140 psi | | 120 psi | |
| ROC | | | | | | | | |
| RT | 285 mm | | 580 mm | | | | 620 mm | |
| 250° C. | 290 mm | | 580 mm | | | | 620 mm | |

Notes on Table V:

Bis-F is bisphenol F epoxy sold under the tradename Epon 862 by Shell Chemical Corporation.

DICY is dicyandiamide.

Epoxy X is a proprietary epoxy.

2130 is Tegomer ESi-2130, an epoxy-terminated polysiloxane, manufactured by Goldschmidt, with the structure

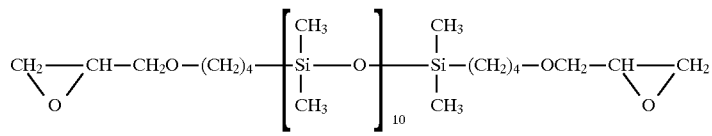

While the invention has been described in conjunction with specific embodiments, it is to be understood that many alternatives, modifications, and variations will be apparent to those skilled in the art in light of the foregoing description. Accordingly, this invention is intended to embrace all such alternatives, modifications, and variations that fall within the scope of the appended claims.

We claim:

1. A method for reducing the bleeding of an epoxy resin composition onto a silicon, metallic, or metallized substrate, wherein the epoxy resin composition contains 1-allyloxy-2,6-di(2,3-epoxypropyl)benzene, a curing catalyst and a filler, said method comprising admixing the epoxy resin composition with an effective amount of a polyhydroxyl compound having two or more hydroxyl groups, or an effective amount of a monohydroxyl compound having one or more phenyl groups.

2. A method according to claim 1, in the which the polyhydroxyl or monohydroxyl compound is selected from the group consisting of resorcinol, bisphenol A, 4,-4'-biphenol, 4-benzyloxy phenol, bisphenol F, 3,4-dimethyl phenol, styrene glycol, phenylethyl alcohol, 1,3-dioxane-5,5-dimethanol, ribonic-gamma-lactone, ethylene glycol, glycerol and phenol novolac resin.

3. A semiconductor device consisting of a silicon chip or die bonded to a metallic or metallized lead frame, wherein the chip or die is bonded with an epoxy resin composition which has been prepared by the process of claim 1.

4. A semiconductor device consisting of a silicon chip or die bonded to a metallic or metallized lead frame, wherein the chip or die is bonded with an epoxy resin composition prepared by the process of claim 2.

* * * * *